United States Patent
Shim

(10) Patent No.: US 7,303,988 B2
(45) Date of Patent: Dec. 4, 2007

(54) METHODS OF MANUFACTURING MULTI-LEVEL METAL LINES IN SEMICONDUCTOR DEVICES

(75) Inventor: Sang Chul Shim, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 356 days.

(21) Appl. No.: 11/027,035

(22) Filed: Dec. 30, 2004

(65) Prior Publication Data

US 2005/0170632 A1 Aug. 4, 2005

(30) Foreign Application Priority Data

Dec. 31, 2003 (KR) .................... 10-2003-0101906

(51) Int. Cl.
- H01L 21/00 (2006.01)
- H01L 21/4763 (2006.01)
- H01L 21/44 (2006.01)
- H01L 29/40 (2006.01)

(52) U.S. Cl. ............... 438/636; 438/72; 438/622; 438/623; 438/624; 438/625; 438/626; 438/629; 438/636; 438/648; 438/656; 438/672; 438/675; 257/758; 257/759; 257/760; 257/762; 257/763; 257/764; 257/765; 257/766; 257/767; 257/768

(58) Field of Classification Search ............ None
See application file for complete search history.

(56) References Cited

U.S. PATENT DOCUMENTS

| | | | |
|---|---|---|---|
| 5,913,142 A * | 6/1999 | Chang | 438/626 |
| 6,133,145 A * | 10/2000 | Chen | 438/636 |
| 6,376,361 B1 * | 4/2002 | Chooi et al. | 438/631 |
| 6,939,794 B2 * | 9/2005 | Yin et al. | 438/624 |
| 7,008,869 B2 * | 3/2006 | Han | 438/622 |
| 2004/0137719 A1 * | 7/2004 | Jin | 438/637 |
| 2004/0157462 A1 * | 8/2004 | Hillyer et al. | 438/710 |

FOREIGN PATENT DOCUMENTS

| JP | 08-111460 | 4/1996 |
|---|---|---|
| JP | 10-172971 | 6/1998 |

\* cited by examiner

*Primary Examiner*—Michael Lebentritt
*Assistant Examiner*—James M Mitchell
(74) *Attorney, Agent, or Firm*—Andrew D. Fortney

(57) ABSTRACT

Methods of forming a multi-level metal line of a semiconductor device are disclosed. One example method includes subsequently stacking first and second metal layers, wherein a conductive etching stopper layer is interposed at an interface between the first and second metal layers; forming first and second metal layer pattern by patterning the first metal layer, the etching stopper layer, and the second metal layer, wherein the first metal layer pattern is formed as a lower metal line; forming a connection contact in form of a plug by selectively etching the second metal layer pattern until the etching stopper layer is exposed; forming an interlayer insulating layer to cover the connection contact and the first metal layer pattern; and exposing an upper surface of the connection contact by planarizing the interlayer insulating layer.

18 Claims, 6 Drawing Sheets

METHODS OF MANUFACTURING MULTI-LEVEL METAL LINES IN SEMICONDUCTOR DEVICES

TECHNICAL FIELD

The present invention relates to semiconductor manufacturing and, more particularly, to a method of manufacturing multi-level lines in semiconductor devices.

BACKGROUND

In order to improve productivity and shorten production time, it is important to simplify manufacturing steps. In addition, because semiconductor devices are highly integrated, design rules have been further lowered. In addition, a multi-level metal line structure and the associated stack via process have been widely developed and used in order to implement high-speed semiconductor devices. However, in the stack via process, there is a problem in that severe misalignment of the stack via may occur. Therefore, there are problems of photoresist pattern rework and a low yield.

In addition, a conventional method of forming a multi-level metal line has too many complicated manufacturing steps. Therefore, there are demands to simplify the manufacturing steps of the method in order to reduce production costs and shorten product time.

FIGS. 1A to 1D are schematic cross sectional views for explaining steps of a method of forming a multi-level metal line of a conventional semiconductor device.

Referring to FIG. 1A, in the method of forming a multi-level metal line of a conventional semiconductor device, a metal layer 12 is formed on a semiconductor substrate 10 where a predetermined lower structure is formed. Here, a conductive diffusion barrier metal layer 14 is interposed between the metal layer 12 and the substrate 10. In addition, a conductive anti-reflection coating (ARC) layer 16 is formed on the metal layer 12. Next, a patterning process using a photoresist pattern is performed to form a metal line 12, 14, 16. An interlayer insulating layer 18 is formed using a deposition method or the like to cover the entire surface of the resultant structure including the metal line 12, 14, 16. Next, a step difference between the upper portions of the interlayer insulating layer 18 is removed by using a planarization process such as a chemical mechanical polishing (CMP) process.

Referring to FIG. 1B, a patterning process using a photoresist pattern is performed on the interlayer insulating layer 18 to form a via contact hole 20 for exposing the metal line 12, 14, 16. Here, in a state that the thick interlayer insulating layer 18 covers the metal line 12, 14, 16, a photoresist pattern for the via contact hole 20 must be accurately aligned to the metal line 12, 14, 16. Therefore, in a stack via process, an abnormally-etched portion 22 may occur due to misalignment of the photoresist pattern.

The abnormally-etched portion 22 may increase resistance of via contact and degrade reliability of metal lines due to electro-migration (EM).

Referring to FIG. 1C, a conductive diffusion barrier metal layer 24 is formed on the inner side of the via contact hole 20. Subsequently, a metal layer 26 for a via plug is deposited on the entire surface of the resultant structure. Here, the metal layer 26 is made of tungsten (W).

Referring to FIG. 1D, a planarization process such as a CMP process is performed to polish and remove the metal layer 26 and the anti-diffusion coating layer 24 on the interlayer insulating layer 18. As a result, the upper surface of the interlayer insulating layer 18 is exposed and the tungsten (W) is only remained within the via contact hole 20, so that a via plug 26 is formed.

As described above, the conventional method is complicated and, since tungsten (W) is used as a via filling material, resistance of via contact increases. In addition, reliability of metal lines due to electro-migration (EM) is degraded.

DETAILED DESCRIPTION

Figure 1A:
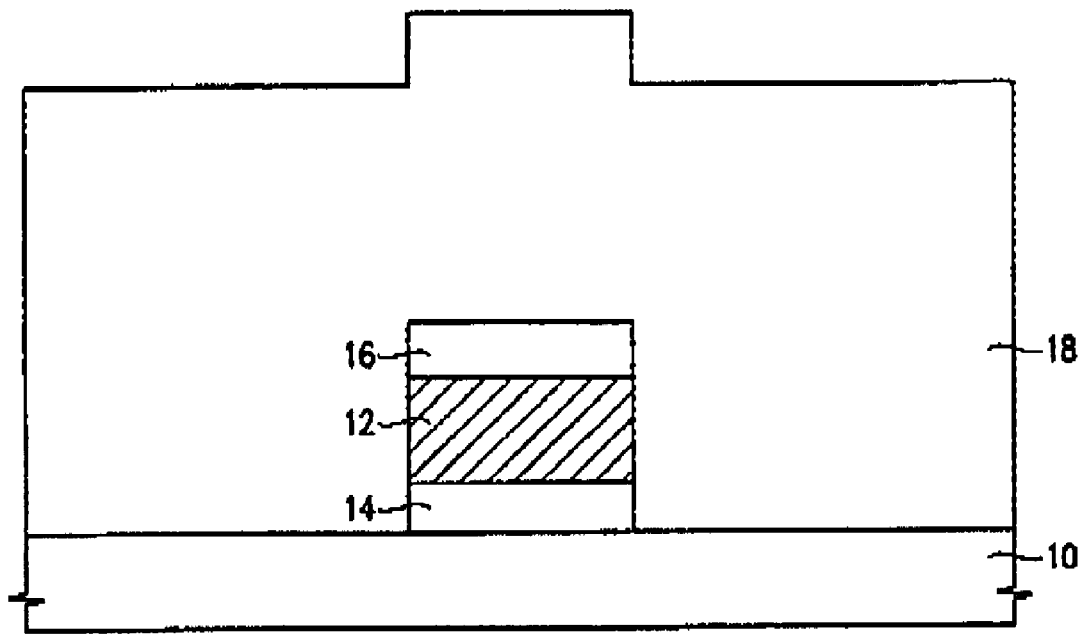
FIGS. 1A to 1D are schematic cross sectional views for explaining steps of a method of forming a multi-level metal line of a conventional semiconductor device.
Figure 1B:
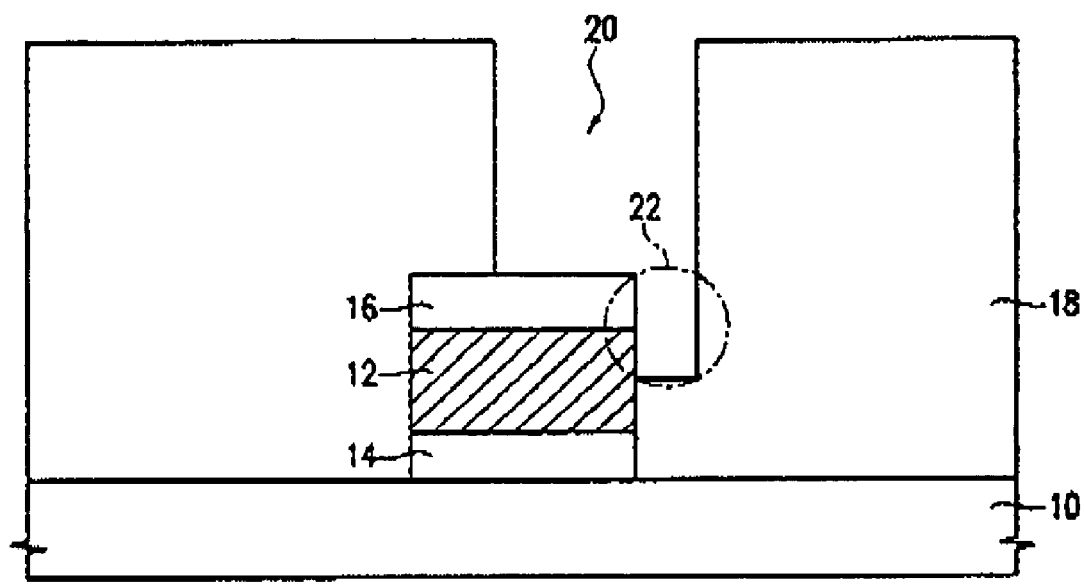
Figure 1C:
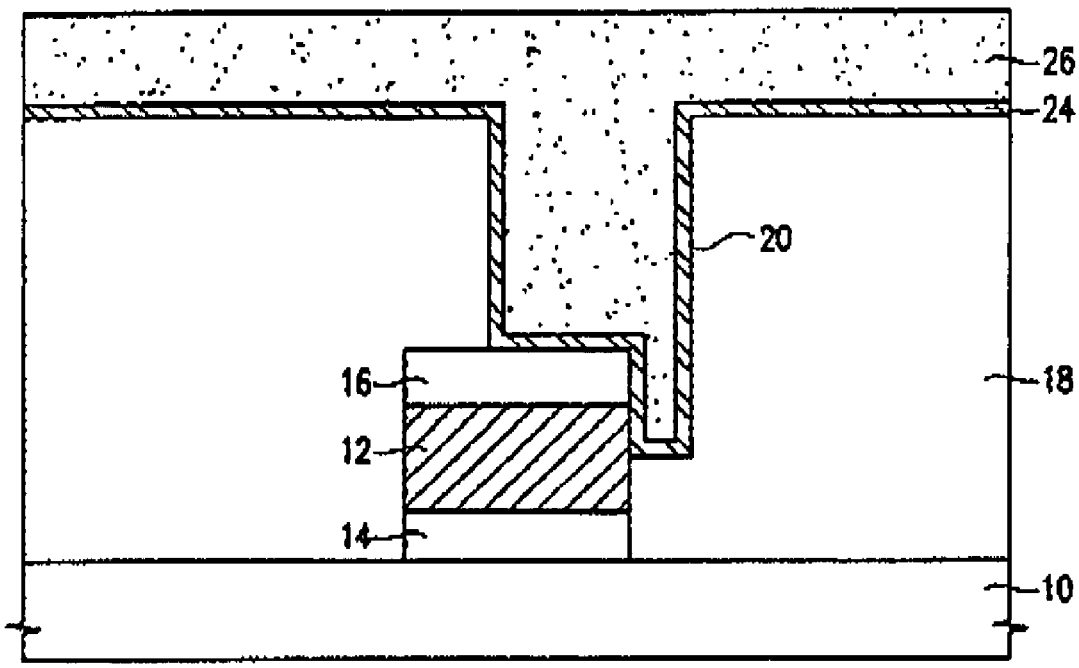
Figure 1D:
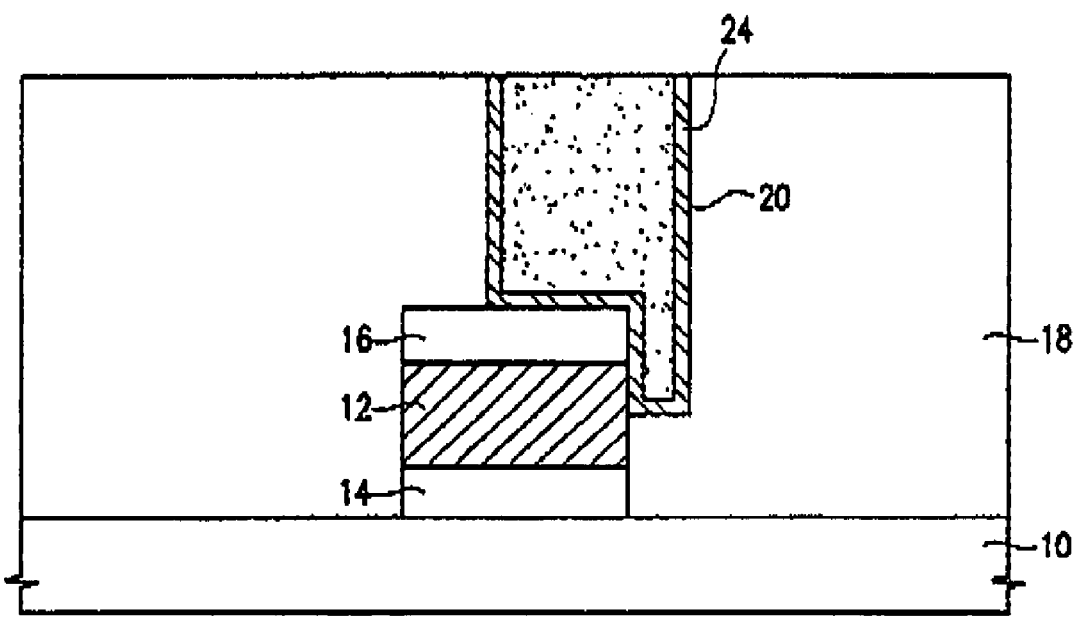
Figure 2A:
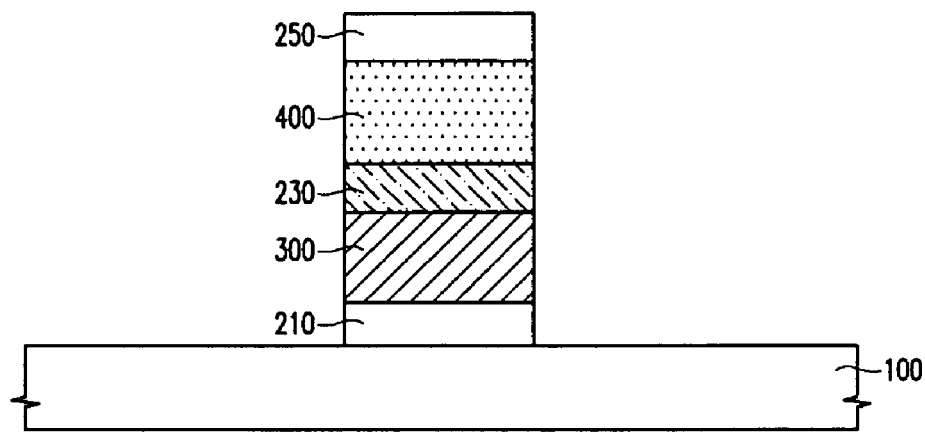
FIGS. 2A to 2F are schematic cross sectional views for explaining a method of forming a multi-level metal line in a semiconductor device.
Figure 2B:
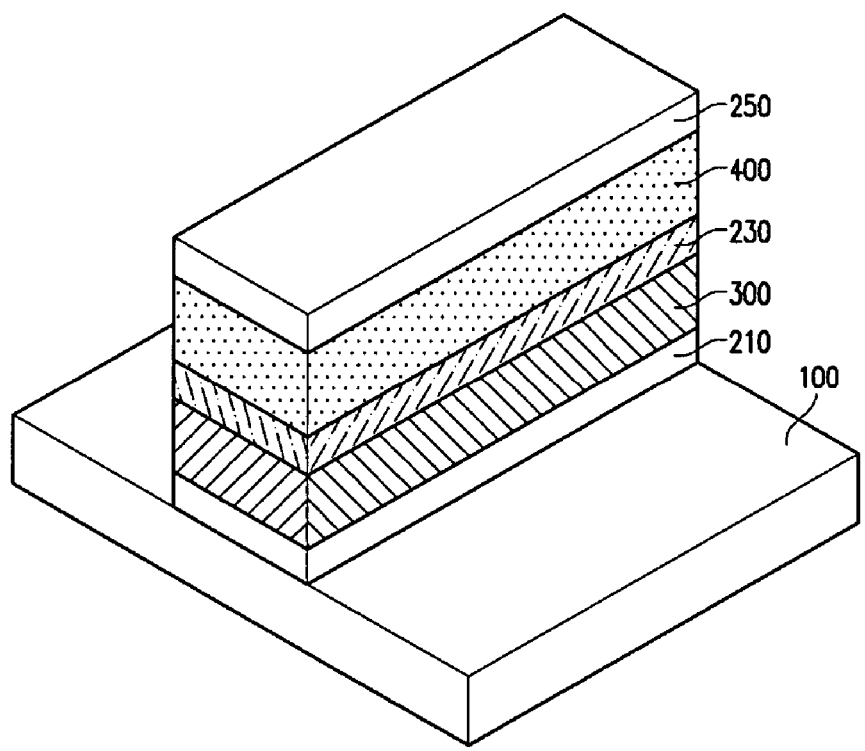

Referring to FIGS. 2A and 2B, a first metal layer 300 is formed on a semiconductor substrate 100 where a predetermined lower structure is formed; and a second metal layer 400 is formed on the first metal layer 300. According to one example, the first and second metal layers are made of aluminum (Al). In addition, a conductive diffusion barrier metal layer 210 is interposed between the first metal layer 300 and the substrate 100. In addition, a conductive etching stopper layer 230 is interposed between the first metal layer 300 and second metal layer 400. In addition, a conductive anti-reflection coating (ARC) layer 250 is formed on second metal layer 400.

Here, the conductive diffusion barrier metal layer 210, the conductive etching stopper layer 230, and the ARC layer 250 may be constructed with a titanium (Ti) layer, a titanium nitride (TiN) layer, a multi-level layer thereof, a tantalum (Ta) layer, a tantalum nitride (TaN), or a multi-level layer thereof.

Next, the resultant structure is patterned in a form of line by a selective dry etching process using a first photoresist pattern (not shown), so that the first metal layer pattern 300 can be used as lower metal lines as shown in FIG. 2B.

Figure 2C:
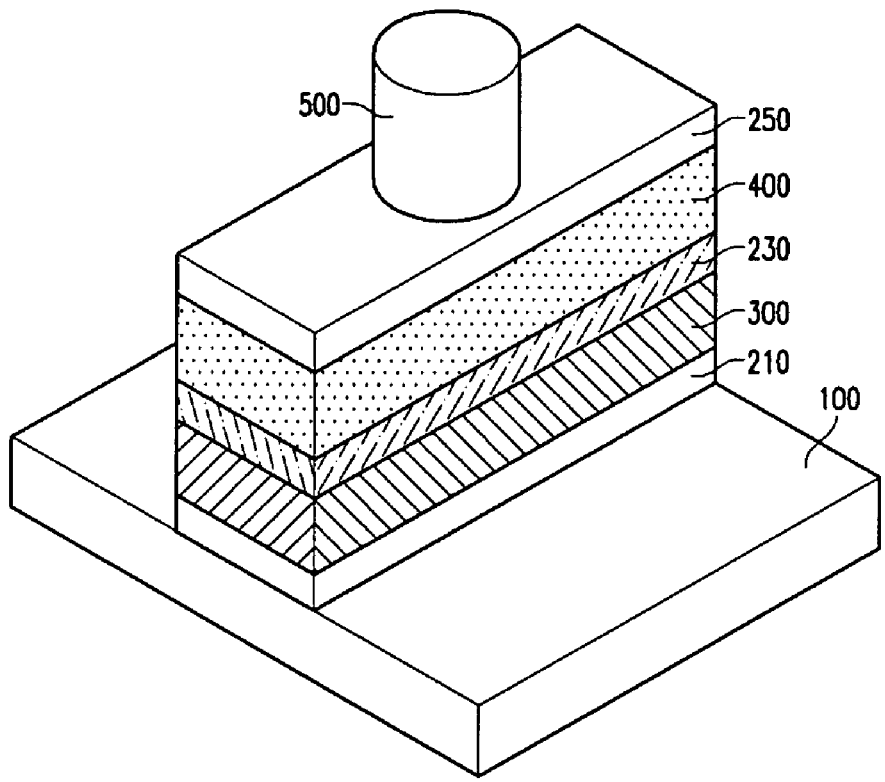

Referring to FIG. 2C, a second photoresist pattern 500 is formed on the second metal layer pattern 400, more specifically, on the ARC layer 250 formed on the second metal layer pattern 400. In one example, the second photoresist pattern 500 is a negative type photoresist pattern. This because a photomask used to form an existing positive type photoresist pattern for the via contact holes can be used to form the second photoresist pattern 500.

The second photoresist pattern 500 is disposed on portions of the second metal layer masking the existing via contact holes. That is, the second photoresist pattern 500 is formed to mask the portions where via connection contacts or via plugs are formed. As described above, in a conventional method, in a state that a thick interlayer insulating layer covers the metal line, a photoresist pattern for the via contact hole must be accurately aligned to the metal line, so that severe misalignment of the stack via may occur. However, as disclosed herein, the second photoresist pattern 500 is formed on the exposed second metal layer pattern 400 which is stacked on the first metal layer pattern 300. Therefore, misalignment therebetween can be prevented.

Figure 2D:
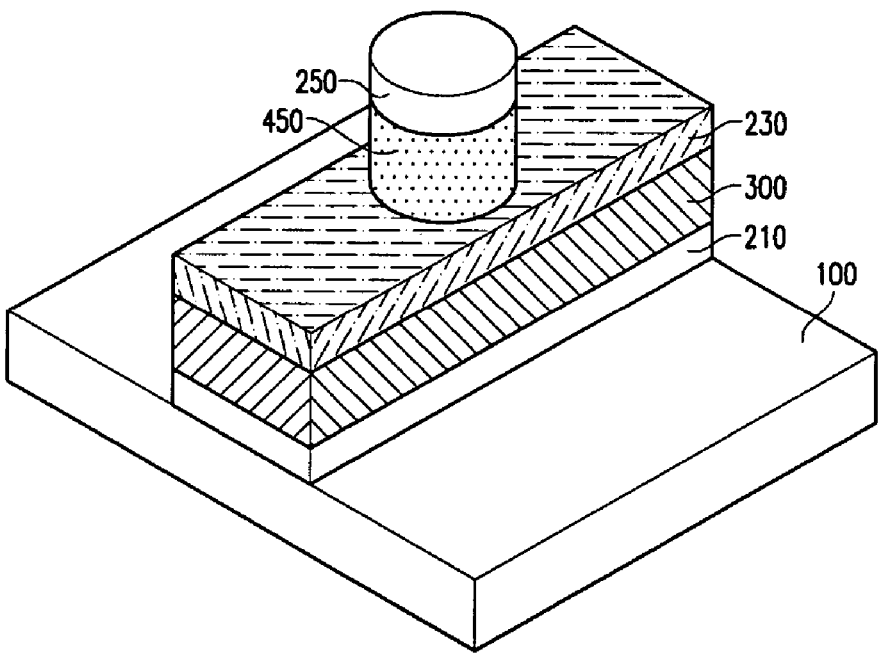

Referring to FIG. 2D, the exposed ARC layer 250 and the second metal layer pattern 400 are patterned by performing a dry etching process using the second photoresist pattern 500 as an etching mask. The dry etching process proceeds until the conductive etching stopper layer 230 underlying the second metal layer pattern 400 is exposed.

As a result, the second metal layer pattern 400 is patterned in form of via plug 450. Next, the second photoresist pattern 500 on the via plug 450 is removed, so that a plug pattern, that is, via connection contact, comprising the via plug 450 and a portion of the ARC layer 250 on the via plug 450 can be obtained.

Figure 2E:
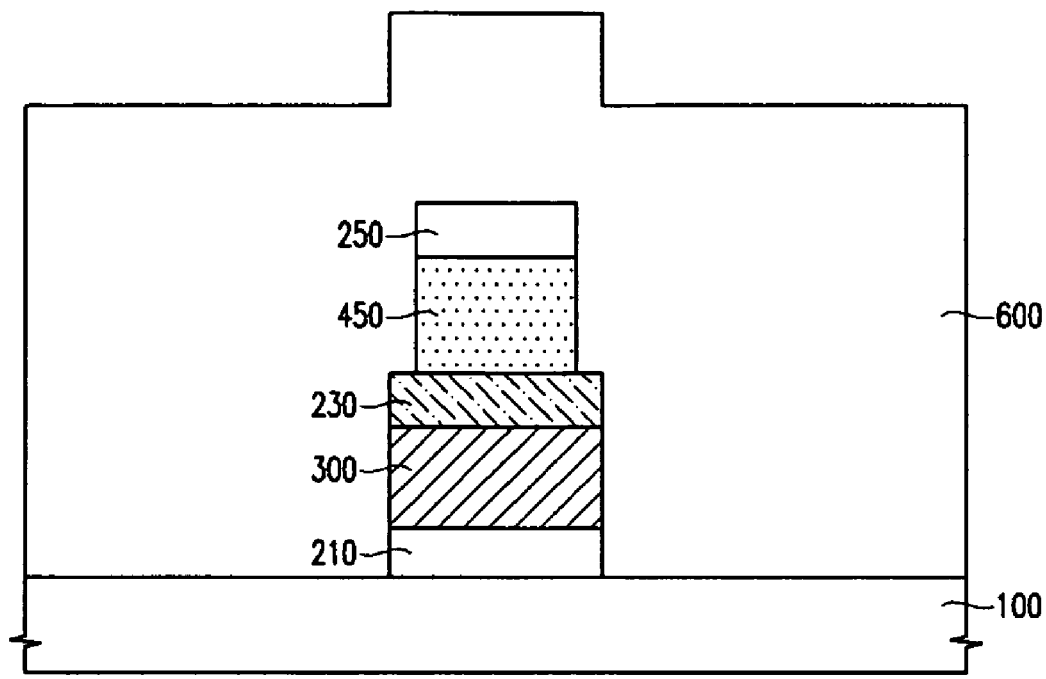

Referring to FIG. 2E, an interlayer insulating layer 600 is formed to cover the resultant structure including the patterned via plug 450. The interlayer insulating layer 600 may be formed by using a chemical vapor deposition (CVD) method, or the like. The interlayer insulating layer 600 is made of an insulating material selected among BPSG, PSG, USG, P-TEOS, FSG, HDP, PEOX, black diamond, SILK, CORAL, and LKD in accordance with its use.

Figure 2F:
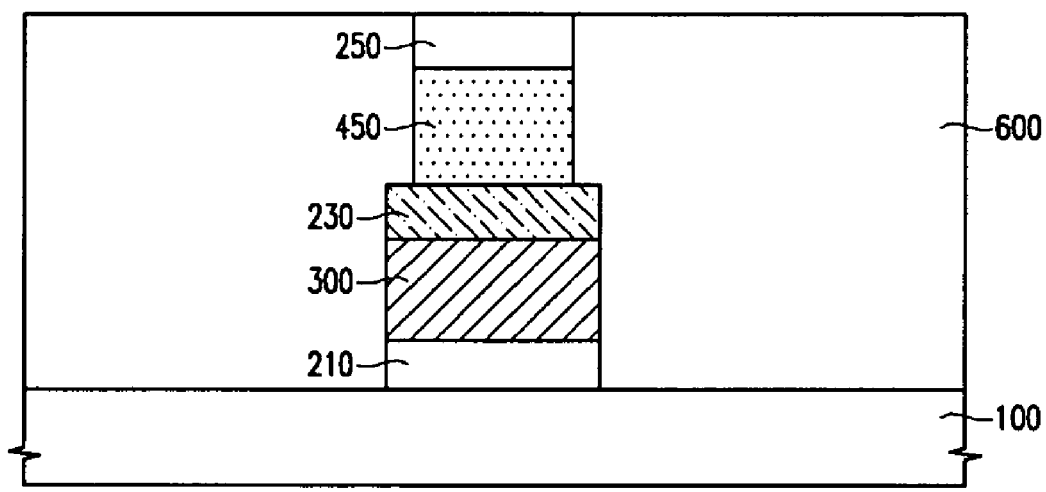

Referring to FIG. 2F, the surface of the interlayer insulating layer 600 is planarized by using a planarization process such as a process. The planarization process proceeds until the ARC layer 250 is exposed.

Figure 2G:
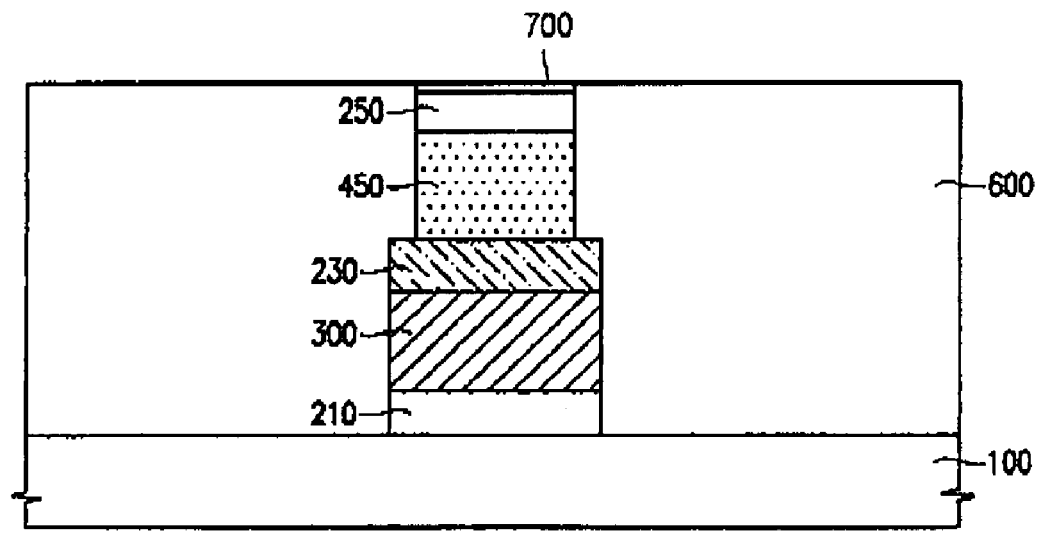
FIG. 2G shows an alternate embodiment of the present invention comprising a planarization stopper layer.

To avoid polishing of the via plug 450 during the planarization process, an additional planarization stopper layer 700 (see FIG. 2G) may be formed to cover the ARC layer 250 and the via plug 450. In addition, in a case where the conductive etching stopper layer 230 is not formed or in a case where a non-conductive etching stopper layer is formed and then removed, the planarization stopper layer is directly formed on the via plug 450.

The planarization stopper layer is made of a material for adjusting polishing selection ratio, such as silicon nitride (SiN), silicon oxide nitride (SiON), silicon carbide (SiC), and silicon carbon nitride (SiCN).

As a result, an upper metal line formed on the exposed conductive etching stopper layer 230 can be electrically connected to the first metal layer pattern 210 through the via plug 450, thereby implementing a multi-level metal line structure.

As disclosed herein, a process for depositing barrier metal within a via contact hole, a tungsten deposition process, a tungsten CMP process, and the like following the via contact hole forming process can be omitted in a conventional metallization process of a semiconductor device. Therefore, production time of semiconductor device can be reduced.

Additionally, because a photoresist pattern for via connection contact is formed on an exposed metal line, it is possible to effectively minimize or prevent misalignment of a stack via. In addition, since the via connection contact can be made of a low-resistivity material such as aluminum (Al) instead of tungsten (W), it is possible to reduce via resistance and/or RC delay time.

Because the metal line and the via connection contact can be made of the same metal, for example, aluminum (Al), it is possible to completely prevent electro-migration (EM) between the via connection contact and the metal line. Accordingly, it is possible to improve reliability of the metal line.

A method of forming a multi-level metal line of a semiconductor device capable of simplifying manufacturing process and preventing misalignment between a lower metal line and a via connection contact is disclosed.

As disclosed herein, there is provided a method of forming multi-level metal lines of semiconductor device, comprising subsequently stacking first and second metal layers, wherein a conductive etching stopper layer is interposed at an interface between the first and second metal layers; forming first and second metal layer pattern by patterning the first metal layer, the etching stopper layer, and the second metal layer, wherein the first metal layer pattern is formed as a lower metal line; forming a connection contact in form of a plug by selectively etching the second metal layer pattern until the etching stopper layer is exposed; forming an interlayer insulating layer to cover the connection contact and the first metal layer pattern; and exposing an upper surface of the connection contact by planarizing the interlayer insulating layer.

The first or second metal layer may be made of aluminum (Al), copper (Cu), or tungsten (W). In some arrangements, the first and second metal layers may be made of the same metal.

According to one example, the method may further include forming a conductive diffusion barrier metal layer underlying the first metal layer, wherein the conductive diffusion barrier metal layer is constructed with a titanium (Ti) layer, a titanium nitride (TiN) layer, tantalum (Ta) layer, a tantalum nitride (TaN), or a multi-level layer thereof.

In addition, the method may further include forming an anti-reflection coating layer on the second metal layer, wherein the anti-reflection coating layer is constructed with a titanium (Ti) layer, a titanium nitride (TiN) layer, tantalum (Ta) layer, a tantalum nitride (TaN), or a multi-level layer thereof.

The etching stopper layer may be constructed with a titanium (Ti) layer, a titanium nitride (TiN) layer, a tantalum (Ta) layer, a tantalum nitride (TaN), or a multi-level layer thereof.

In addition, forming the connection contact may include forming a negative-type photoresist pattern on the second metal layer pattern to mask portions thereof where via connection contacts are formed; and etching the second metal layer pattern by using the photoresist pattern as an etching mask until the etching stopper layer is exposed.

The method may further include a step of forming a planarization stopper layer at an interface between the interlayer insulating layer and the connection contact, wherein the planarization stopper layer is made of silicon nitride (SiN), silicon oxide nitride (SiON), silicon carbide (SiC), or silicon carbon nitride (SiCN).

As disclosed herein, it is possible to provide a method of forming a multi-level metal line of a semiconductor device capable of simplifying manufacturing process and preventing misalignment between a lower metal line and a via connection contact.

It is noted that this patent claims priority from Korean Patent Application Serial Number 10-2003-0101906, which was filed on Dec. 31, 2003, and is hereby incorporated by reference in its entirety.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming multi-level metal lines of a semiconductor device, comprising:

sequentially stacking a first metal layer, a conductive etching stopper layer, a second metal layer, and an anti-reflection coating layer;

forming first and second metal layer patterns by patterning the first metal layer, the conductive etching stopper layer, the second metal layer, and the anti-reflection coating layer, wherein the first metal layer pattern forms a lower metal line;

forming a connection contact by selectively etching the second metal layer pattern until the etching stopper layer is exposed;

forming an insulating layer to cover the connection contact and the first metal layer pattern; and exposing an upper surface of the connection contact by planarizing the insulating layer.

2. The method of claim 1, wherein the first metal layer comprises aluminum (Al).

3. The method of claim 1, wherein the first metal layer comprises copper (Cu) or tungsten (W).

4. The method of claim 1, wherein the first and second metal layers comprise a same metal.

5. The method of claim 1, further comprising, before sequentially stacking the first metal layer, the conductive stopper layer, the second metal layer, and the anti-reflection coating layer, forming a conductive diffusion barrier metal layer comprising a titanium (Ti) layer, a titanium nitride (TiN) layer, tantalum (Ta) layer, a tantalum nitride (TaN), or a multi-level layer thereof.

6. The method of claim 1, wherein the anti-reflection coating layer comprises a titanium (Ti) layer, a titanium nitride (TiN) layer, tantalum (Ta) layer, a tantalum nitride (TaN) layer or a multi-level layer thereof.

7. The method of claim 1, wherein the etching stopper layer comprises a titanium (Ti) layer, a titanium nitride (TiN) layer, a tantalum (Ta) layer, a tantalum nitride (TaN) layer, or a multi-level layer thereof.

8. The method of claim 1, wherein forming the connection contact comprises:

forming a negative-type photoresist pattern on the second metal layer pattern to mask portions thereof where connection contacts are formed; and etching the second metal layer pattern using the photoresist pattern as an etching mask until the etching stopper layer is exposed.

9. The method of claim 1, further comprising forming a planarization stopper layer on the connection contact, wherein the planarization stopper layer comprises silicon nitride (SiN), silicon oxide nitride (SiON), silicon carbide (SiC), or silicon carbon nitride (SiCN).

10. The method of claim 1, wherein the second metal layer comprises aluminum (Al).

11. The method of claim 1, wherein the first and second metal layers comprise aluminum (Al).

12. The method of claim 1, wherein the second metal layer comprises copper (Cu) or tungsten (W).

13. The method of claim 1, wherein the second metal layer comprises tungsten (W).

14. The method of claim 1, wherein the first and second metal layers comprise copper (Cu).

15. The method of claim 1, wherein forming the first and second metal layer patterns comprises forming a first photoresist pattern on the anti-reflection coating layer.

16. The method of claim 15, wherein forming to first and second metal layer patterns further comprises patterning the anti-reflection coating layer, the second metal layer, the conductive etching stopper layer, and the first metal layer by dry etching, using the first photoresist pattern.

17. The method of claim 1, wherein forming the second metal layer pattern comprises forming a second photoresist pattern on portions of the anti-reflection coating layer.

18. The method of claim 17, wherein forming the second metal layer pattern further comprises patterning the anti-reflection coating layer and the second metal layer by dry etching, using the second photoresist pattern as a mask, until the etching stopper layer is exposed.

* * * * *